(12) United States Patent
Lee

(10) Patent No.: US 12,303,992 B2
(45) Date of Patent: May 20, 2025

(54) HYBRID BASE PLATE

(71) Applicant: AMOSENSE CO.,LTD, Cheonan-si (KR)

(72) Inventor: Jihyung Lee, Cheonan-si (KR)

(73) Assignee: AMOSENSE CO., LTD, Cheonan-si (KR)

( * ) Notice: Subject to any disclaimer, the term of this patent is extended or adjusted under 35 U.S.C. 154(b) by 177 days.

(21) Appl. No.: 18/011,458

(22) PCT Filed: Jun. 8, 2021

(86) PCT No.: PCT/KR2021/007105
§ 371 (c)(1),
(2) Date: Dec. 19, 2022

(87) PCT Pub. No.: WO2021/261805
PCT Pub. Date: Dec. 30, 2021

(65) Prior Publication Data
US 2023/0264284 A1    Aug. 24, 2023

(30) Foreign Application Priority Data

Jun. 23, 2020  (KR) .................. 10-2020-0076179

(51) Int. Cl.
*B32B 15/01*  (2006.01)
*B23K 1/00*  (2006.01)
(Continued)

(52) U.S. Cl.
CPC ................ *B23K 1/20* (2013.01); *B23K 1/008* (2013.01); *B23K 1/19* (2013.01); *B23K 20/02* (2013.01);
(Continued)

(58) Field of Classification Search
CPC .. B23K 2103/12; B23K 2103/18; B23K 1/20; B23K 1/008; B23K 1/19; B23K 20/22;
(Continued)

(56) References Cited

U.S. PATENT DOCUMENTS 4,766,041 A * 8/1988 Mizuhara ............. B23K 35/302
228/262.9
8,946,745 B2   2/2015 Seong
(Continued)

FOREIGN PATENT DOCUMENTS

CN        101599522 A    12/2009
CN        102099934 A     6/2011
(Continued)

OTHER PUBLICATIONS

Machine Translation, Shinko Electric Ind, JP 2001-135760 A, May 2001. (Year: 2001).*

(Continued)

*Primary Examiner* — Michael E. La Villa
(74) *Attorney, Agent, or Firm* — Maschoff Brennan

(57) ABSTRACT

The present invention relates to a hybrid base plate and a manufacturing method therefor. Metal sheets of different materials having excellent thermal conductivity can be joined to have a thickness favorable for heat dissipation, and by arranging a metal sheet of a material with a low coefficient of thermal expansion between metal sheets with a high coefficient of thermal expansion, there is an effect of preventing warpage when manufacturing a large-area heat sink.

5 Claims, 6 Drawing Sheets

(51) Int. Cl.
  *B23K 1/008* (2006.01)
  *B23K 1/19* (2006.01)
  *B23K 1/20* (2006.01)
  *B23K 20/02* (2006.01)
  *B23K 20/22* (2006.01)
  *B23K 20/233* (2006.01)
  *B32B 15/04* (2006.01)
  *B32B 15/20* (2006.01)
  *B32B 37/06* (2006.01)
  *C23C 14/02* (2006.01)
  *B23K 103/12* (2006.01)
  *B23K 103/18* (2006.01)
  *C23C 14/16* (2006.01)

(52) U.S. Cl.
  CPC ............ *B23K 20/22* (2013.01); *B23K 20/233* (2013.01); *B32B 15/01* (2013.01); *B32B 15/018* (2013.01); *B32B 15/04* (2013.01); *B32B 15/043* (2013.01); *B32B 15/20* (2013.01); *B32B 37/06* (2013.01); *C23C 14/025* (2013.01); *B23K 2103/12* (2018.08); *B23K 2103/18* (2018.08); *B32B 2307/308* (2013.01); *C23C 14/024* (2013.01); *C23C 14/165* (2013.01); *Y10T 428/12806* (2015.01); *Y10T 428/12812* (2015.01); *Y10T 428/12819* (2015.01); *Y10T 428/12826* (2015.01); *Y10T 428/12833* (2015.01); *Y10T 428/1284* (2015.01); *Y10T 428/12868* (2015.01); *Y10T 428/12882* (2015.01); *Y10T 428/12896* (2015.01); *Y10T 428/12903* (2015.01); *Y10T 428/1291* (2015.01); *Y10T 428/12917* (2015.01); *Y10T 428/12924* (2015.01)

(58) Field of Classification Search
  CPC ...... B23K 20/233; B23K 20/02; B32B 15/01; B32B 15/04; B32B 15/043; B32B 15/20; B32B 15/018; B32B 37/06; B32B 2307/308; C23C 14/025; C23C 14/024; C23C 14/165; Y10T 428/12806; Y10T 428/12812; Y10T 428/12819; Y10T 428/12826; Y10T 428/12833; Y10T 428/1284; Y10T 428/12868; Y10T 428/12882; Y10T 428/12896; Y10T 428/12903; Y10T 428/1291; Y10T 428/12917; Y10T 428/12924
  See application file for complete search history.

(56) References Cited

U.S. PATENT DOCUMENTS

| | | | |
|---|---|---|---|
| 10,032,648 | B2 | 7/2018 | Oohiraki et al. |
| 2009/0258248 | A1 | 10/2009 | Tsushima |

FOREIGN PATENT DOCUMENTS

| | | | |
|---|---|---|---|
| CN | 105580131 | A | 5/2016 |
| JP | 06-268117 | A | 9/1994 |
| JP | 2001-135760 | A | 5/2001 |
| JP | 2010-120034 | A | 6/2010 |
| JP | 2017-123303 | A | 7/2017 |
| KR | 10-2015-0096168 | A | 8/2015 |
| KR | 10-1574265 | B1 | 12/2015 |
| KR | 10-2018-0017634 | A | 2/2018 |

OTHER PUBLICATIONS

CN Office Action dated Jan. 24, 2025 as received in Application No. 202180060474.3.

* cited by examiner

[FIG. 1]
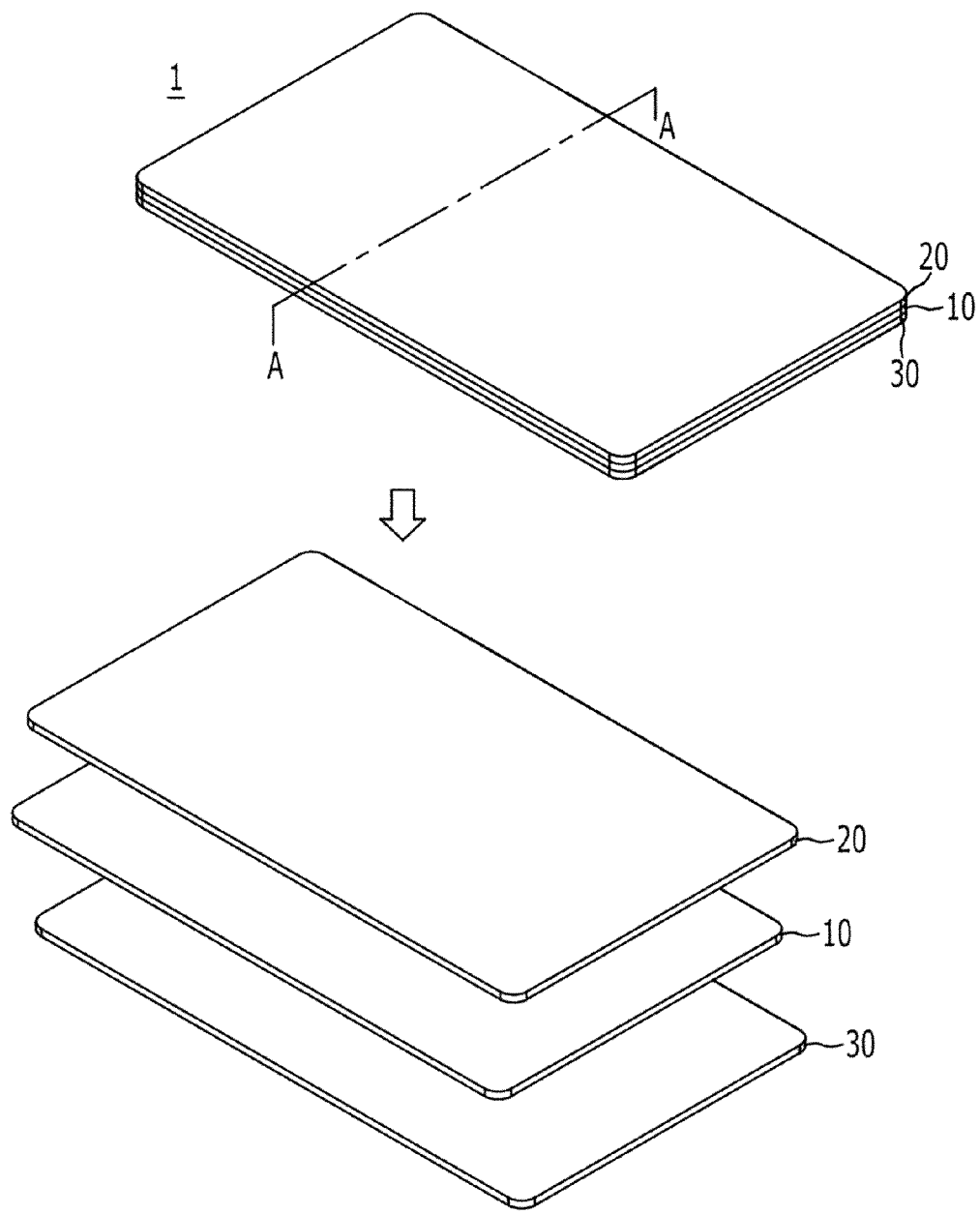

[FIG. 2]
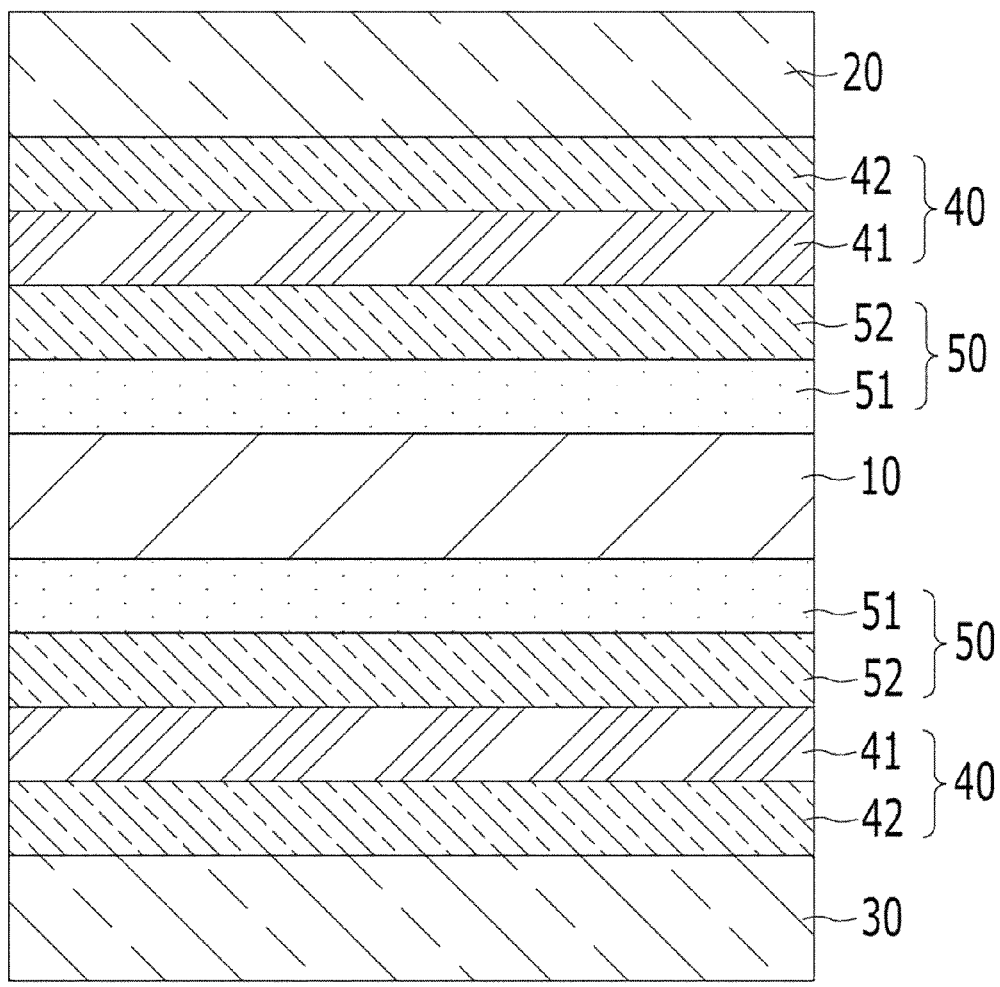

[FIG. 3]
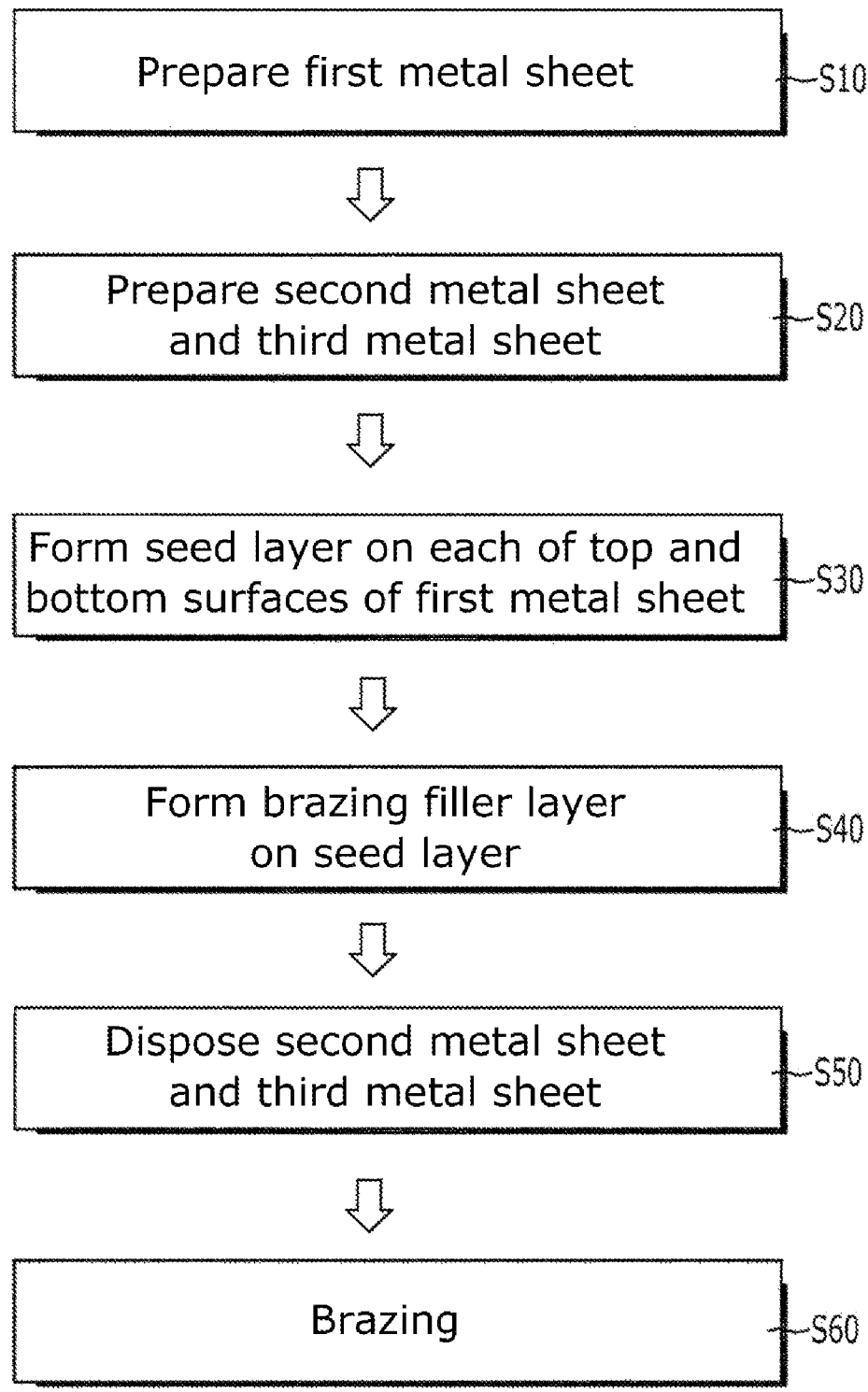

[FIG. 4]
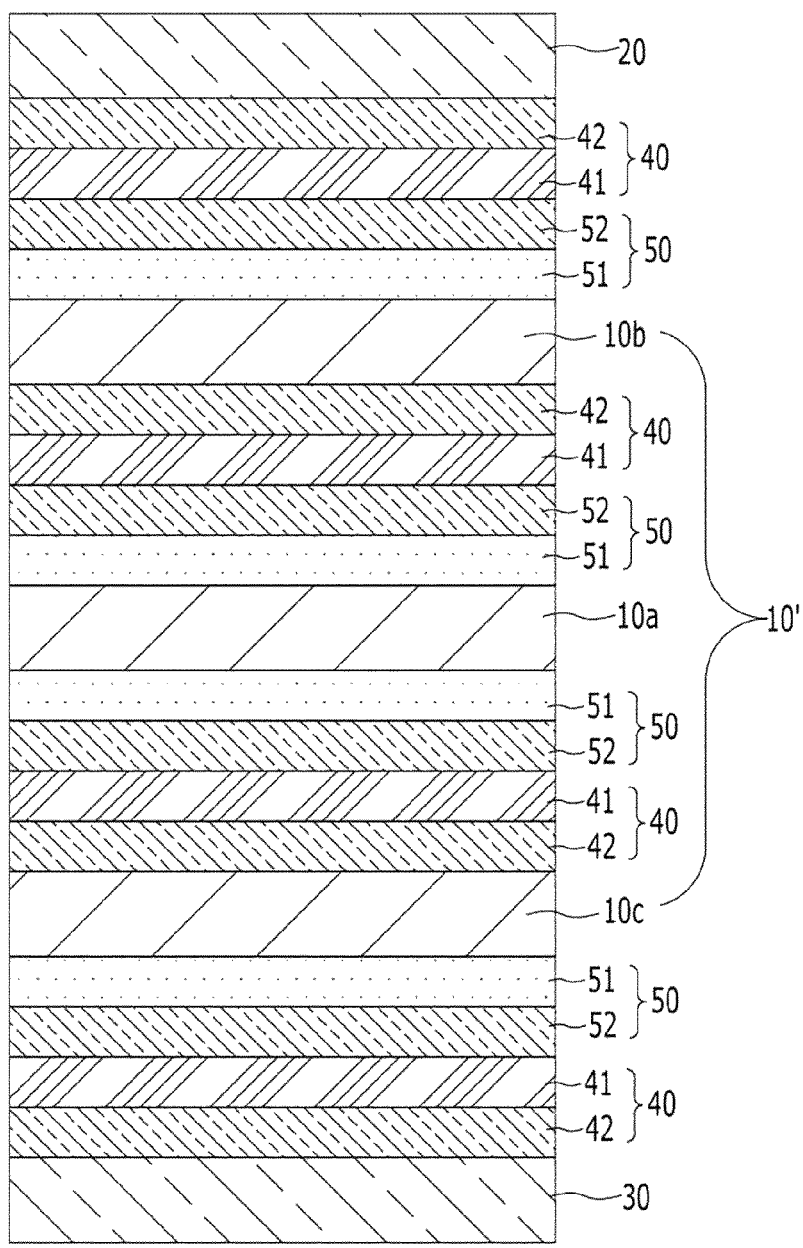

[FIG. 5]
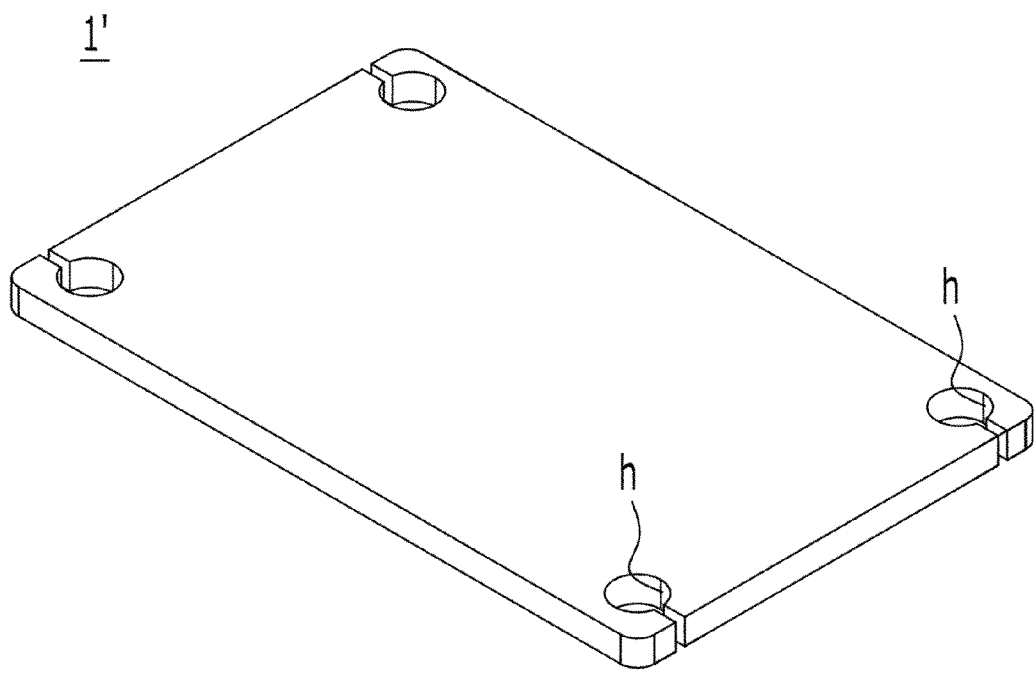

[FIG. 6]
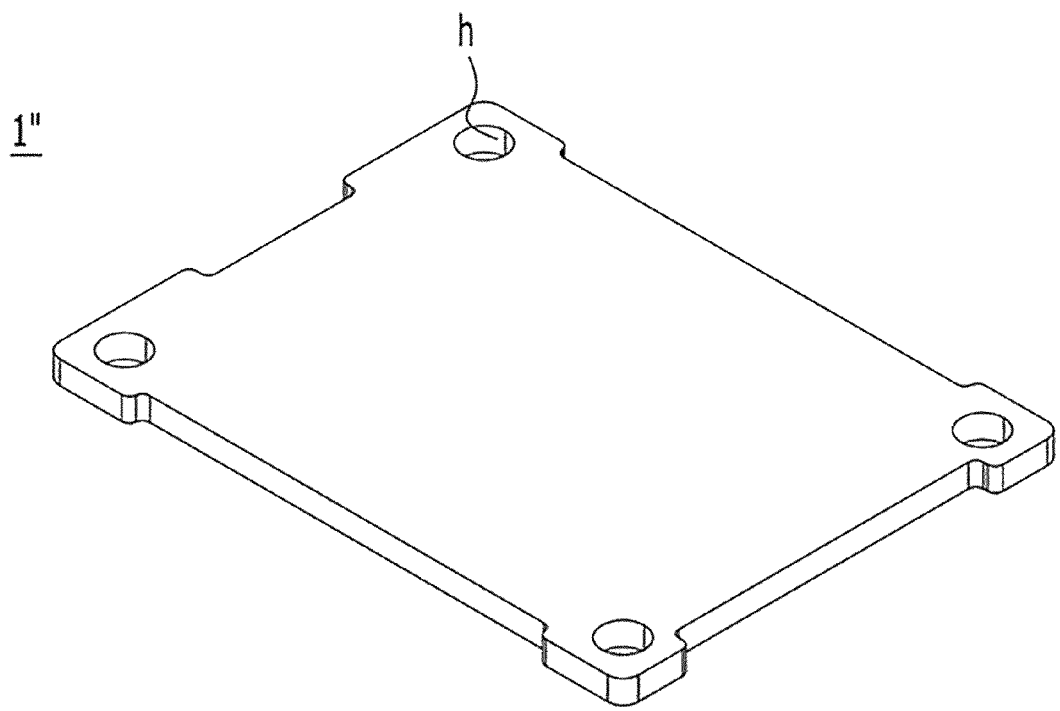

HYBRID BASE PLATE

TECHNICAL FIELD

The present invention relates to a hybrid base plate and a manufacturing method thereof, and more particularly, to a hybrid base plate having a low coefficient of thermal expansion (CTE) and a manufacturing method thereof.

BACKGROUND ART

In general, a base plate is formed in a rectangular plate shape and is formed of an aluminum or copper material. Such a base plate may be bonded to a bottom surface of a substrate and used as a heat sink. Such a base plate is solder-bonded to the bottom surface of the substrate so as to be favorable to heat dissipation, or is bonded using a silver (Ag) paste or the like having high thermal conductivity.

However, when the base plate and the substrate each have a large area, the joint area is wide so that warpage may occur due to a difference in thermal expansion. In addition, the silver paste melts at a high operating temperature, which may cause warpage, defects, or the like of the base plate, and in the case of copper, there is a problem in that warpage occurs at a temperature of 200° C. or higher.

As a solution to this, a metal sheet made of a material that prevents warpage may be applied, but there is a problem in that it is difficult to secure a thickness advantageous to heat dissipation.

DISCLOSURE

Technical Problem

An object of the present invention is to provide a hybrid base plate having a low coefficient of thermal expansion by bonding metal sheets of different materials so as to have excellent thermal conductivity and prevent the occurrence of warpage when applied to a large area, and a manufacturing method thereof.

Another object of the present invention is to provide a hybrid base plate which can secure a thickness advantageous to heat dissipation by securing bonding characteristics between metal sheets of different materials, and a manufacturing method thereof.

Technical Solution

According to features of the present invention for achieving the objects as described above, the present invention may provide a hybrid base plate including a first metal sheet, a second metal sheet brazing-bonded to a top surface of the first metal sheet, and a third metal sheet brazing-bonded to a bottom surface of the first metal sheet, wherein the second metal sheet and the third metal sheet are formed of the same metal material, and the first metal sheet is formed of a metal material different from the second metal sheet and the third metal sheet.

The first metal sheet may be made of one metal sheet of Mo, W, CuMo, and CuW, or a mixed metal sheet thereof, and the second metal sheet and the third metal sheet may each be made of a Cu metal sheet.

The first metal sheet may be made of a metal sheet having a three-layer bonded structure of CuMo/Mo/CuW, and the second metal sheet and the third metal sheet may each be made of a Cu metal sheet.

The hybrid base plate may include brazing filler layers disposed between the first metal sheet and the second metal sheet and between the first metal sheet and the third metal sheet.

The brazing filler layer may include an Ag layer and a Cu layer formed on the Ag layer.

The hybrid base plate may further include a seed layer disposed between the first metal sheet and the brazing filler layer.

The seed layer may include a Ti layer and a Cu layer formed on the Ti layer.

The present invention may provide a method for manufacturing a hybrid base plate, the method comprising steps of preparing a first metal sheet, preparing a second metal sheet and a third metal sheet which are each formed of a metal material different from the first metal sheet, forming a seed layer on each of top and bottom surfaces of the first metal sheet, forming a brazing filler layer on the seed layer, disposing the second metal sheet and the third metal sheet respectively on the brazing filler layers, and performing brazing bonding.

In the step of preparing the first metal sheet, one metal sheet of Mo, W, CuMo, and CuW, or a mixed metal sheet thereof may be prepared as the first metal sheet.

In the step of preparing the first metal sheet, a metal sheet having a three-layer bonded structure in which a metal sheet made of CuMo is bonded to the top surface of the metal sheet made of Mo and a metal sheet made of CuW is bonded to the bottom surface of the metal sheet made of Mo may be prepared as the first metal sheet.

In the step of preparing the second metal sheet and the third metal sheet which are formed of a metal material different from the first metal sheet, a metal sheet made of Cu may be prepared as each of the second metal sheet and the third metal sheet.

The step of forming the seed layer on each of the top and bottom surfaces of the first metal sheet may include steps of forming a Ti layer on each of the top and bottom surfaces of the first metal sheet by a sputtering method, and forming a Cu layer on the Ti layer by a sputtering method.

The step of forming the brazing filler layer on the seed layer may include steps of forming an Ag layer by plating the seed layer with Ag and forming a Cu layer by plating the Ag layer with Cu.

The step of performing brazing bonding may be performed at 780 to 950° C., and upper weighting or pressurizing may be performed during brazing.

Advantageous Effects

The present invention can bond metal sheets of different materials having excellent thermal conductivity to manufacture the metal sheets having a thickness favorable for heat dissipation, and can arrange a metal sheet made of a material with a low coefficient of thermal expansion between metal sheets with a high coefficient of thermal expansion so that the metal sheets have a low coefficient of thermal expansion. Accordingly, the present invention can prevent the occurrence of warping during manufacturing into a large area, and secure the bonding characteristics between metal sheets of different materials by brazing bonding.

Further, the present invention can secure a thickness advantageous to heat dissipation by manufacturing different materials in multiple layers, and can maximize the heat dissipation effect since the brazing filler layer for brazing bonding facilitates the movement of heat so that the heat moves quickly to the copper sheet of the outermost layer.

Therefore, the present invention can be very usefully applied to a heat sink or the like requiring conditions such as high heat dissipation and operational reliability.

DESCRIPTION OF DRAWINGS

FIG. 1 is a view showing a hybrid base plate according to an embodiment of the present invention.

FIG. 2 is a cross-sectional view showing the hybrid base plate of the present invention taken along line A-A in FIG. 1.

FIG. 3 is a process chart for explaining a method for manufacturing the hybrid base plate according to the embodiment of the present invention.

FIG. 4 is a cross-sectional view showing a hybrid base plate according to another embodiment of the present invention.

FIGS. 5 and 6 are views showing application examples of the hybrid base plate according to the embodiment of the present invention.

MODE FOR INVENTION

Hereinafter, embodiments of the present invention will be described in detail with reference to the accompanying drawings.

FIG. 1 is a view showing a hybrid base plate according to an embodiment of the present invention.

As shown in FIG. 1, the hybrid base plate 1 (hereinafter referred to as a base plate) 1 according to the present invention is formed by bonding a plurality of metal sheets of different materials. For example, the base plate 1 includes a first metal sheet 10, a second metal sheet 20, and a third metal sheet 30, and is formed in a structure in which the second metal sheet 20 is bonded to the top surface of the first metal sheet 10, and the third metal sheet 30 is bonded to the bottom surface of the first metal sheet 10.

The second metal sheet 20 and the third metal sheet 30 are formed of the same metal material, and the first metal sheet 10 is formed of a metal material different from the second metal sheet 20 and the third metal sheet 30.

The first metal sheet 10 is formed of a metal material having a low coefficient of thermal expansion, and the second metal sheet 20 and the third metal sheet 30 that are respectively bonded to the top and bottom surfaces of the first metal sheet 10 are each formed of a material having excellent thermal conductivity. A base plate 1 having a low coefficient of thermal expansion may be manufactured by bonding the second and third metal sheets 20 and 30 each made of a material having excellent thermal conductivity respectively to the top and bottom surfaces of the first metal sheet 10 made of a material having a low coefficient of thermal expansion.

The first metal sheet 10 may be made of one of Mo, W, CuMo, and CuW, or a mixed layer thereof, and the second metal sheet 20 and the third metal sheet 30 may be made of Cu. Mo, W, CuMo, and CuW each have a relatively low coefficient of thermal expansion, and Cu has a relatively large coefficient of thermal expansion. Cu has a coefficient of thermal expansion of 17 ppm/K and a thermal conductivity of 393 W/m K, CuMo has a coefficient of thermal expansion of 7.0 ppm/K and a thermal conductivity of 160 W/m K, and CuW has a coefficient of thermal expansion of 6.5 ppm/K and a thermal conductivity of 180 W/m·K.

As in the embodiment, since the first metal sheet 10 is made of CuMo, and the second metal sheet 20 and the third metal sheet 30 are each made of Cu, the base plate 1 may be formed in a three-layer bonded metal sheet structure of Cu/CuMo/Cu. CuMo is for preventing the occurrence of warpage, and Cu is for securing thermal conductivity for heat dissipation.

The base plate 1 of the embodiment is formed in a three-layer metal sheet structure in which a Cu material metal sheets having a relatively high coefficient of thermal expansion but high thermal conductivity is bonded to each of the top and bottom surfaces of a CuMo material metal sheet having a relatively low coefficient of thermal expansion, and thus the warpage of the Cu material metal sheets may be absorbed by the CuMo material metal sheet to reduce a warpage phenomenon caused by the difference in coefficient of thermal expansion at high temperatures.

If a heat sink is manufactured using only Cu, Cu has a coefficient of thermal expansion of 17 ppm/K, and thus warpage occurs when the heat sink is bonded to a substrate.

Alternatively, the base plate may be formed into a three-layer structure of Cu/CuMo/Cu by infiltrating the CuMo material metal sheet into molten metal to coat each of top and bottom surfaces of the CuMo material metal sheet with a Cu layer, and then rolling the Cu layer-coated CuMo material metal sheet. However, the method for forming the Cu layer on each of the top and bottom surfaces of the CuMo material metal sheet by infiltrating the CuMo material metal sheet into molten metal cannot manufacture a base plate having a thickness of 1.0 mm or more.

Meanwhile, in the embodiment of the present invention, it is possible to form a three-layer structure or a multi-layer bonded structure by bonding the Cu material metal sheets to the top and bottom surfaces of the CuMo material metal sheet, and thus there is no critical point for thickness.

In the embodiment, the CuMo material metal sheet for forming the first metal sheet 10 may have a thickness of 0.6T, and the Cu material metal sheet for forming the second metal sheet 20 and the third metal sheet 30 may have a thickness of 0.2 T. In this case, a base plate having a thickness of 1.0 T (mm) may be manufactured if the first to third metal sheets are formed in a three-layer bonded metal sheet structure of Cu/CuMo/Cu.

In another embodiment, a first metal sheet 10' is formed in a three-layer bonded metal sheet structure of CuMo/Mo/CuW, the second metal sheet 20 is bonded to the top surface of the first metal sheet 10', and the third metal sheet 30 is bonded to the bottom surface of the first metal sheet 10' so that the base plate may be formed in a five-layer bonded metal sheet structure of Cu/CuMo/Mo/CuW/Cu. Other embodiments will be described in detail with reference to FIG. 4.

FIG. 2 is a cross-sectional view showing the hybrid base plate of the present invention taken along line A-A in FIG. 1.

As shown in FIG. 2, the first metal sheet 10, the second metal sheet 20, and the third metal sheet 30 are brazing-bonded.

The base plate 1 includes a brazing filler layer 40 for brazing-bonding of the first metal sheet 10, the second metal sheet 20, and the third metal sheet 30. The brazing filler layers 40 are disposed between the first metal sheet 10 and the second metal sheet 20 and between the first metal sheet 10 and the third metal sheet 30.

The brazing filler layer 40 may be one of Ag, Cu, and AgCu alloys. Ag, Cu, and AgCu alloys have high thermal conductivity and transfer the heat transferred to the second metal sheet 20 to the first metal sheet 10 and the third metal sheet 30 to facilitate heat emission. In addition, Ag, Cu, and AgCu alloys increase bonding force between metal sheets that are different materials. The brazing filler layer 40 may be formed to a thickness of 1 μm or more and 10 μm or less. The brazing filler layer 40 may be in a thin film having a multilayer structure. For example, the brazing filler layer 40 may include an Ag layer 41 and a Cu layer 42 formed on the Ag layer 41. The Ag layer 41 may have a thickness of 7 μm, and the Cu layer 42 may have a thickness of 3 μm. This allows the Ag layer 41 and the Cu layer 42 to have a ratio of 7:3, which increases bonding force. The brazing filler layer 40 may be formed by a method such as paste printing, thin film foil attachment, or the like.

The base plate 1 further includes a seed layer 50 disposed between the first metal sheet 10 and the brazing filler layer 40. The seed layer 50 is for improving wettability of the first metal sheet 10 and the brazing filler layer 40. That is, the seed layer 50 facilitates the attachment of the brazing filler layer 40 to the first metal sheet 10.

The seed layer 50 may be one of Ti, Cu, and TiCu alloys. Ti, Cu, and TiCu alloys have good wettability and increase the adhesion of the brazing filler layer 40 to each of the top and bottom surfaces of the first metal sheet 10. The seed layer 50 is formed in a thin film. The seed layer 50 may be formed in a thin film having a multilayer structure. For example, the seed layer 50 may include a Ti layer 51 with which each of the top and bottom surfaces of the first metal sheet 10 is thin film coated, and a Cu layer 52 with which the Ti layer 51 is thin film-coated. The Ti layer 51 may have a thickness of 2,000 Å, and the Cu layer 52 formed on the Ti layer 51 may have a thickness of 5,000 Å. The seed layer 50 is formed by a sputtering method.

The above-described base plate 1 is manufactured by forming the seed layer 50, including the Ti layer 51 and the Cu layer 52, on each of the top and bottom surfaces of the first metal sheet 10, forming the brazing filler layer 40, including the Ag layer 41 and the Cu layer 42, on each of the top and bottom surfaces of the first metal sheet 10 on which the seed layer 50, is formed, disposing the second metal sheet 20 and the third metal sheet 30 respectively on the top and bottom surfaces of the first metal sheet 10 on which the brazing filler layers 40 are formed, and performing brazing bonding.

FIG. 3 is a process chart for explaining a method for manufacturing the hybrid base plate according to the embodiment of the present invention.

As shown in FIGS. 2 and 3, the method for manufacturing a base plate according to the present invention comprises steps of preparing the first metal sheet 10 (S10), preparing the second metal sheet 20 and the third metal sheet 30 which are each formed of a metal material different from the first metal sheet 10 (S20), forming the seed layer 50 on each of the top and bottom surfaces of the first metal sheet 10 (S30), forming the brazing filler layer 40 on the seed layer 50 (S40), disposing the second metal sheet 20 and the third metal sheet 30 on the brazing filler layer 40 (S50), and performing brazing bonding (S60).

In the step (S10) of preparing the first metal sheet, one metal sheet of Mo, W, CuMo, and CuW, or a mixed metal sheet thereof is prepared as the first metal sheet 10. For example, a metal sheet made of CuMo may be prepared as the first metal sheet 10. The first metal sheet 10 may be prepared in a thickness range of 0.3 T to 0.9 T, and for example, the first metal sheet 10 having a thickness of 0.6 T may be prepared.

In the step (S20) of preparing the second metal sheet and the third metal sheet which are formed of a metal material different from the first metal sheet, a metal sheet made of Cu may be prepared as each of the second metal sheet 20 and the third metal sheet 30. The second metal sheet 20 and the third metal sheet 30 may each be prepared in a thickness range of 0.25 T to 0.55 T. For example, the second metal sheet 20 and the third metal sheet 30 which each have a thickness of 0.2 T may be prepared.

In the step (S30) of forming the seed layer on each of the top and bottom surfaces of the first metal sheet, a step of forming the Ti layer 51 on each of the top and bottom surfaces of the first metal sheet 10 by a sputtering method, and a step of forming the Cu layer 52 on the Ti layer 51 by a sputtering method may be performed. The Ti layer 51 may be formed to a thickness of 2,000 Å by Ti sputtering, and the Cu layer 52 formed on the Ti layer 51 may be formed to a thickness of 5,000 Å by Cu sputtering.

In the step (S40) of forming a brazing filler layer on the seed layer, a step of forming the Ag layer 41 by plating, with Ag, the seed layer 50 on each of the top and bottom surfaces of the first metal sheet 10 and a step of forming the Cu layer 42 by plating the Ag layer 41 with Cu may be performed. The Ag layer 41 may be formed to a thickness of 7 μm by Ag plating, and the Cu layer 42 may be formed to a thickness of 3 μm by Cu plating.

Alternatively, the step (S40) of forming the brazing filler layer on the seed layer may be performed by a method such as Ag or Cu paste printing, Ag or Cu foil attachment, or the like other than plating.

In the step (S50) of disposing the second metal sheet 20 and the third metal sheet 30 on the brazing filler layer 40, the second metal sheet 20 is disposed on the brazing filler layer 40 formed on the top surface of the first metal sheet 10 and the third metal sheet 30 is disposed on the brazing filler layer 40 formed on the bottom surface of the first metal sheet 10, and thus a three-layer structure of the second metal sheet 20/the first metal sheet 10/the third metal sheet 30 may be formed.

The step (S60) of performing brazing bonding is performed at 780 to 950° C., and upper weighting or pressurizing may be performed during brazing.

For example, in the step of performing brazing bonding, a laminate of the first to third metal sheets 10, 20, and 30 is prepared, in which the second metal sheet 20 is disposed on the top surface of the first metal sheet 10 on which the seed layer 50 and the brazing filler layer 40 are formed, and the third metal sheet 30 is disposed on the bottom surface of the first metal sheet 10, the laminate is disposed between an upper pressurization jig and a lower pressurization jig in a brazing furnace, and the upper pressurization jig and lower pressurization jig pressurize the laminate from top and bottom surfaces of the laminate during heating. Alternatively, the laminate is disposed in the brazing furnace, and a weight is disposed on the top surface of the laminate to pressurize the laminate from the top of the laminate. Performing the upper weighting or pressurizing in the step of performing brazing bonding is for bonding without voids.

The brazing process may be performed in a brazing furnace of reducing atmosphere or vacuum, and the brazing filler layer 40 may contain a component and composition for easy brazing temperature control. An efficient brazing process can be achieved by controlling the heating temperature in the brazing furnace to 780° C. or higher, preferably the range of 780 to 950° C. As an example, a preferred brazing temperature is 870° C.

In the base plate 1 of the above-described embodiment, the first metal sheet 10 is made of a CuMo material having a low coefficient of thermal expansion, and the second metal sheet 20 and the third metal sheet 30 are each made of a Cu material having high thermal conductivity, so that an example has been described, in which the base plate is formed in a three-layer bonded metal sheet structure of Cu/CuMo/Cu.

Besides, the first metal sheet 10 is made of an Mo material, and the second metal sheet 20 and the third metal sheet 30 are each made of a Cu material so that the base plate 1 may be formed in a three-layer bonded metal sheet structure of Cu/Mo/Cu. Alternatively, the first metal sheet 10 is made of a W material, and the second metal sheet 20 and the third metal sheet 30 are each made of a Cu material, so that the base plate 1 may be formed in a three-layer bonded metal sheet structure of Cu/W/Cu. Alternatively, the first metal sheet 10 is made of a CuW material, and the second metal sheet 20 and the third metal sheet 30 are each made of a Cu material, so that the base plate 1 may be formed in a three-layer bonded metal sheet structure of Cu/CuW/Cu.

Meanwhile, in another embodiment, the first metal sheet 10 is formed in a three-layer bonded metal sheet structure of CuMo/Mo/CuW, the second metal sheet 20 is bonded to the top surface of the first metal sheet 10, the third metal sheet 30 is bonded to the bottom surface of the first metal sheet 10, so that the base plate 1a may be formed in a five-layer bonded metal sheet structure of Cu/CuMo/Mo/CuW/Cu.

FIG. 4 is a cross-sectional view showing a hybrid base plate according to another embodiment of the present invention.

As shown in FIG. 4, in a base plate 1a according to another embodiment of the present invention, the first metal sheet 10' is formed in a three-layer bonded structure of a CuMo metal sheet 10b/an Mo metal sheet 10a/a CuW metal sheet 10c, and the second metal sheet 20 bonded to the top surface of the first metal sheet 10' and the third metal sheet 30 bonded to the bottom surface of the first metal sheet 10' are each made of a Cu metal sheet.

The first metal sheet 10' is manufactured by forming the seed layer 50 including the Ti layer 51 and the Cu layer 52, on each of top and bottom surfaces of the Mo metal sheet 10a, forming the brazing filler layer 40, including the Ag layer 41 and the Cu layer 42, on each of the top and bottom surfaces of the Mo metal sheet 10a on which the seed layer 50 is formed, disposing the CuMo metal sheet 10b and the CuW metal sheet 10c respectively on the top and bottom surfaces of the Mo metal sheet 10a on which the brazing filler layers 40 are formed, respectively, and performing brazing bonding.

In addition, the base plate 1a may be manufactured by forming the seed layer 50, including the Ti layer 51 and the Cu layer 52, on each of the top and bottom surfaces of the first metal sheet 10' formed in the three-layer bonded structure of the CuMo metal sheet 10b/the Mo metal sheet 10a/the CuW metal sheet 10c, forming the brazing filler layer 40, including the Ag layer 41 and the Cu layer 42, on each of the top and bottom surfaces of the first metal sheet 10' on which the seed layer 50 is formed, disposing the second metal sheet 20 and the third metal sheet 30 respectively on the top and bottom surfaces of the first metal sheet 10' on which the brazing filler layers 40 are formed, and performing brazing bonding.

There is an advantage in that the 5-layer bonded metal sheet structure of Cu/CuMo/Mo/CuW/Cu described above can be manufactured to a thickness of 3.0 mm or more, and the bonded metal sheet structure has no critical point for thickness when manufactured into multi-layers of 5 layers or more. Therefore, is easy to apply the bonded metal sheet structure to a heat sink that has to secure an advantageous thickness for heat dissipation.

The above-described base plates 1 and 1a are integrally formed by brazing-bonding a copper sheet to each of the top and bottom surfaces of one metal sheet of Mo, W, CuMo, and CuW or a laminated metal sheet thereof. Therefore, the base plates 1 and 1a can have excellent thermal conductivities, can lower the coefficient of thermal expansion, can minimize thermal stress, and can have excellent bonding force between metals of different materials to satisfy the requirements for reliability and high heat dissipation.

In addition, since the above-described base plates 1 and 1a are integrated by stacking a plurality of metals of different materials, the base plates 1 and 1a can be manufactured to a desired thickness of 3 mm or more without a critical point for thickness, and can maximize the heat dissipation effect.

The above-described base plates 1 and 1a each have a strength of 150 MPa or more, a warpage change amount of 0.05 mm or less when soldered to a bottom surface of a ceramic substrate at about 250° C., and thermal properties such as a coefficient of thermal expansion in the range of 6.8 to 12 ppm/K and a thermal conductivity of 220 to 280 W/m·K.

The above-described base plates 1 and 1a may function as heat sinks by being bonded to the bottom surface of the ceramic substrate constituting a power module with solder or silver (Ag) paste. Here, the ceramic substrate may be an AMB substrate or a DBC substrate.

FIGS. 5 and 6 are views showing application examples of the hybrid base plate according to the embodiment of the present invention.

As shown in FIG. 5, base plates 1' and 1" may be formed in a three-layer bonded metal sheet structure of Cu/CuMo/Cu or a five-layer bonded metal sheet structure of Cu/CuMo/Mo/CuW/Cu. Each of the above-mentioned base plates 1' and 1" may be manufactured by brazing-bonding through the seed layer 50 and the brazing filler layer 40, and then may be finally manufactured into a desired shape by processing side surfaces thereof through wire cutting processing and forming bolt holes h in required positions thereof, and performing surface pickling after forming the bolt holes h.

The base plates 1' and 1" manufactured by the above-described method have a coefficient of thermal expansion in the range of 6.8 to 12 ppm/K, which is lower than copper or aluminum having a coefficient of thermal expansion of 17 ppm/K or more. Therefore, the base plates 1' and 1" can replace the conventional heat sink made of copper (Cu) or aluminum (Al) to minimize thermal stress and prevent the occurrence of warpage in a high temperature environment. The base plates 1' and 1" can be manufactured in various shapes.

Further, the shape of the base plate 1' shown in FIG. 5 can be applied to RF communication, and the shape of the base plate 1" shown in FIG. 6 can be applied to a heat sink of a power module.

The above-described base plate manufactured to have low coefficient of thermal expansion may be applied to a base substrate for communication, a heat sink for a power module, a filler member for a DSC power module (a pillar and a spacer for supporting or connecting between substrates), etc. in addition to a general heat sink.

Optimum embodiments of the present invention have been disclosed in the drawings and specification. Herein, specific terms have been used in the present specification, but the terms are used only in the purpose of only describing the present invention, not limiting the meaning of the terms or the scope of the present invention written in the claims. Accordingly, a person with ordinary skill in the art will understand that various modifications and other equivalent embodiments are possible from the embodiments. Accordingly, the true technical range of right of the present invention should be determined by the technical spirit of the claims below.

The invention claimed is:

1. A hybrid base plate comprising:
   a first metal sheet having a three-layer bonded metal sheet structure in which a metal sheet made of CuMo is bonded to a top surface of a metal sheet made of Mo and a metal sheet made of CuW is bonded to a bottom surface of the metal sheet made of Mo;
   a second metal sheet made of Cu material and brazing-bonded to a top surface of the first metal sheet; and
   a third metal sheet made of Cu material and brazing-bonded to a bottom surface of the first metal sheet.

2. The hybrid base plate of claim 1, further comprising brazing filler layers disposed respectively between the first metal sheet and the second metal sheet and between the first metal sheet and the third metal sheet, wherein the second and third metal sheets are brazing-bonded to the first metal sheet through the brazing filler layers.

3. The hybrid base plate of claim 2, wherein each of the brazing filler layers includes an Ag layer formed on each of top and bottom surfaces of the first metal sheet and a Cu layer formed on each of the Ag layers.

4. The hybrid base plate of claim 2, further comprising seed layers disposed between each of the brazing filler layers and each surface of the first metal sheet, wherein the second and third metal sheets are brazing-bonded to the first metal sheet through the brazing filler layers and the seed layers.

5. The hybrid base plate of claim 4, wherein the seed layer includes a Ti layer formed on each of the top and bottom surfaces of the first metal sheet, and a Cu layer formed on each of the Ti layers.

* * * * *